(12) United States Patent
Akagawa (10) Patent No.: US 6,590,291 B2
(45) Date of Patent: Jul. 8, 2003

(54) SEMICONDUCTOR DEVICE AND MANUFACTURING METHOD THEREFOR

(75) Inventor: Masatoshi Akagawa, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/768,364

(22) Filed: Jan. 25, 2001

(65) Prior Publication Data

US 2001/0010627 A1 Aug. 2, 2001

(30) Foreign Application Priority Data

Jan. 31, 2000 (JP) .................................... 2000-021913

(51) Int. Cl.$^7$ ..................... H01L 23/48; H01L 23/52; H01L 29/40
(52) U.S. Cl. ................. 257/774; 257/686; 257/701; 257/774; 257/784; 257/737; 257/738; 257/780; 257/700; 257/698
(58) Field of Search ................. 257/701, 777, 257/774, 723, 686, 680, 784, 778, 698, 738, 780, 700, 750, 737

(56) References Cited

U.S. PATENT DOCUMENTS

| | | | | | |
|---|---|---|---|---|---|
| 5,111,278 | A | * | 5/1992 | Eichelberger | 357/75 |
| 5,703,400 | A | * | 12/1997 | Wojnarowski et al. | 257/723 |
| 5,783,870 | A | * | 7/1998 | Mostafazadeh | 257/791 |
| 5,821,626 | A | * | 10/1998 | Ouchi et al. | 257/778 |
| 6,031,284 | A | * | 2/2000 | Song | 257/701 |
| 6,075,712 | A | * | 6/2000 | McMahon | 361/783 |
| 6,077,757 | A | * | 6/2000 | Mizuno et al. | 438/465 |
| 6,271,469 | B1 | * | 8/2001 | Ma et al. | 174/52.1 |
| 6,355,976 | B1 | * | 3/2002 | Faris | 257/686 |

\* cited by examiner

*Primary Examiner*—Steven Loke
*Assistant Examiner*—Nitin Parekh
(74) *Attorney, Agent, or Firm*—Staas & Halsey LLP (57) ABSTRACT

Semiconductor chips having a thickness of 50 μm or so are imbedded and mounted inside a package, such that multi-level stacking is facilitated by providing external connection terminals on both surfaces of the package, or, alternatively, exposing the terminal formation portions of the wiring pattern, to which the external connection terminals are to be connected, out of a solder resist layer.

5 Claims, 5 Drawing Sheets

SEMICONDUCTOR DEVICE AND MANUFACTURING METHOD THEREFOR

BACKGROUND OF THE INVENTION

1. Field of the Invention

This invention relates to a semiconductor device and manufacturing method therefor, and particularly to technology useful for easily effecting high functionality in semiconductor devices comprising a semiconductor element or elements (chip or chips) mounted in a package.

2. Description of the Related Art

Various forms have been proposed for semiconductor devices constituted by mounting a semiconductor element or elements in a package. One example thereof is a semiconductor device wherein a plurality of semiconductor chips is mounted on one substrate to achieve higher integration and higher functionality.

Specific forms of such a semiconductor device which are known include, for example, those wherein semiconductor chips are mounted respectively on both sides of the substrate, those wherein semiconductor chips are stacked on one side of the substrate, and those wherein a plurality of semiconductor chips is mounted inside the surfaces of the substrate.

In every one of these forms, a wiring pattern is suitably formed on the surface of the substrate, to which wiring patterns the electrode pads (terminals) of the semiconductor chips are electrically connected by wire bonding.

Of course, the electrical connections between the semiconductor chips and the wiring patterns are not limited to wire bonding connections, and flip chip connections and TAB connections and the like can also be used.

In the conventional semiconductor devices described above, because the semiconductor chips are mounted on the substrate mounting surface, the fact that substrates are made in prescribed sizes means that the number of semiconductor chips that can be mounted is limited, which is a disadvantage.

Also, when semiconductor chips are mounted in a stack, it is necessary to make the upper chips smaller in size than the lower chips by an amount equal to the area which is needed to make the wire bonding connections. Hence the mounting area of the upper chip or chips becomes narrow, and there is inherently a limit to the number of chips that can be stacked up.

In this case, when flip chip connections are used, there is no need to provide room for bonding as described above, for which reason, it is possible to increase the number of chip mountings compared to when wire bonding connections are used, but other difficulties arise.

In general, with flip chip mounting, bumps (electrode terminals) made of solder or other metals are formed on the electrode pads of the semiconductor chips, and connections are effected by thermally pressing these bumps down on top of corresponding electrode pads on the printed circuit board or other mounting substrates.

When this approach is applied to layered forms of chips, the upper chip will be flip-chip connected to the lower chip.

In such cases, it is necessary to form electrode pads on the upper surface of the lower chip in such a way that they correspond to the positions of the bumps that are the electrode terminals of the upper chip. Furthermore, when the chips are stacked, the positions of the bumps on the upper chips and the electrode pads on the lower chips must be aligned, resulting in the disadvantage that the overall process becomes complex.

In such a conventional semiconductor device as this, because the semiconductor chips are simply mounted on the mounting surface of the substrate, the number of semiconductor chips mounted is limited, and it is not always possible to realize adequately high functionality or the like, which is a problem.

Also, because the semiconductor chips are mounted in a form in which they are externally attached to the substrate, another disadvantage arises in that the overall semiconductor device becomes relatively thick.

Meanwhile, semiconductor device designs which are different from those of the conventional form described in the foregoing, have been conceived in which the substrate is made multi-layered and the semiconductor chips are placed inside the substrate, in order to achieve even higher integration and higher functionality.

For example, if a multi-layer substrate structure is used which is provided with a plurality of wiring layers, it is possible to electrically interconnect the semiconductor chips and place them three-dimensionally inside the substrate.

However, not only is it not necessarily easy to implant semiconductor chips inside a substrate and form the wiring layers as multiple layers but when consideration is given to the recent demand for packages to be smaller and lighter in weight, there is the problem of having to reduce the overall thickness and make the semiconductor device more compact.

SUMMARY OF THE INVENTION

An object of the present invention, which has been devised in view of the problems in the prior art described in the foregoing, is to provide a semiconductor device with which it is possible to effect a compact configuration when mounting semiconductor elements in a package, with which, as necessary, the three-dimensional arrangement and configuration of the semiconductor elements and the interconnections therebetween can be easily implemented, and which contributes to achieving even higher functionality, and to provide a manufacturing method therefor.

Specifically, the present invention is as follows.

1. A semiconductor device comprising: a wiring substrate, wherein conductor layers having wiring patterns formed on them, are formed on both surfaces thereof, with an insulating layer intervening therebetween, and protective films are formed to cover the wiring patterns and the insulating layer in such a way that terminal formation portions of the wiring patterns to which external connection terminals are to be connected are exposed; and at least one semiconductor element that is mounted and imbedded in that wiring substrate; wherein electrode terminals of the semiconductor element are electrically connected to both wiring patterns on both the surfaces.

2. A semiconductor device comprising: a wiring substrate, wherein a conductor layer having a wiring pattern formed on it, is formed on an insulating layer, and a protective film is formed to cover the wiring pattern and the insulating layer in such a way that terminal formation portions of the wiring pattern to which external connection terminals are to be connected are exposed; and at least one semiconductor element that is mounted and imbedded in that wiring substrate; wherein electrode terminals of the semiconductor element are electrically connected to the wiring pattern.

3. A semiconductor device comprising two or more of the semiconductor devices cited in 1 above, stacked in such a way that they are electrically connected.

4. A stacked semiconductor device comprising one or more of the semiconductor devices cited in 1 above and the semiconductor device cited in 2 above, stacked in such a way that they are electrically connected.

5. The semiconductor device according to claim 1 above, wherein the thickness of the semiconductor element is 100 μm or less.

6. A semiconductor device manufacturing method comprising: a first step for mounting, in a base substrate which comprises a first insulating layer with a first conductor layer comprising a wiring pattern on one surface side thereof, a requisite number of semiconductor elements on the other surface side of the first insulating layer; a second step for forming a second insulating layer so as to cover the semiconductor elements, and forming a second conductor layer comprising a wiring pattern on the second insulating layer; a third step for forming via holes at certain positions in the second conductor layer so as to reach the electrode terminals of the semiconductor elements and for also forming through holes at positions that avoid portions where the semiconductor elements are imbedded, so as to pass completely through in the up-and-down direction; a fourth step for forming a third conductor layer over the entire surface inclusive of the inner wall surfaces of the via holes and through holes; a fifth step for forming a wiring pattern, by effecting patterning, on the third conductor layer, in such a way that electrode terminals of the semiconductor elements are electrically connected to the second conductor layer via conductor layers on the inner wall surfaces of the via holes and also in such a way that the second conductor layer is electrically connected to the first conductor layer via conductor layers on the inner wall surfaces of the through holes; a sixth step for obtaining a structure by forming a protective film covering the wiring patterns and the first and second insulating layers in such a way that the terminal formation portions of the wiring pattern of the third conductor layer to which external connection terminals are to be connected are exposed; and a seventh step for dividing the structure obtained by the sixth step into semiconductor devices in such a way that at least one semiconductor element is contained in each semiconductor device.

7. The semiconductor device manufacturing method according to 6 above, comprising a step for forming external connection terminals comprising metal bumps for the terminal formation portions of the wiring pattern on the third conductor layer, after the sixth step.

8. A semiconductor device manufacturing method comprising: a step I for mounting a requisite number of semiconductor elements on a base substrate; a step II for forming an insulating layer so as to cover the semiconductor elements and the base substrate; a step III for forming via holes at certain positions in the insulating layer in such a way that they extend to the electrode terminals of the semiconductor elements; a step IV for forming a conductor layer on the insulating layer, filling in the via holes, and for effecting patterning to form a wiring pattern; a step V for obtaining a structure, forming a protective film that covers the wiring pattern and the insulating layer in such a way that terminal formation portions of the wiring pattern to which external connection terminals are to be connected are exposed; a step VI for dividing the structure obtained by step V into semiconductor devices in such a way that at least one semiconductor element is contained in each semiconductor device; and a step VII for stacking the semiconductor devices fabricated in this manner in such a way that electrical connection is effected with semiconductor device cited in 1 above.

9. The semiconductor device manufacturing method according to 8 above, comprising a step for forming external connection terminals comprising metal bumps at terminal formation portions of the wiring pattern, after the step V.

According to the semiconductor device relating to 1 above and the manufacturing method relating to 6 above, which constitute a first embodiment aspect of the present invention, semiconductor elements are imbedded/mounted inside a wiring substrate provided as a package, with the result that the semiconductor device can be configured compactly.

Also, because provision is made to the effect that the terminal formation portions of the wiring patterns on both side surfaces of the wiring substrate (package) are exposed out of the protective film, and to the effect that, as necessary, multi-level stacking-up can be effected, three-dimensional structuring of the semiconductor elements and interconnections therebetween can be effected simply with the external connection terminals intervening therebetween, as in the semiconductor device described in 3 above. Thus it is possible to realize higher functionality in the semiconductor device.

Furthermore, according to the semiconductor device relating to 2 above, which is a second embodiment aspect of the present invention, the semiconductor elements are imbedded/mounted inside the wiring substrate as in the first form described in the foregoing, as a result of which the semiconductor device can be configured compactly.

Also, by stacking this semiconductor device while electrically connecting it to the semiconductor device relating to 1 above, as in 4 above, it is possible to effect higher functionality in the semiconductor device.

The reason why division into the semiconductor devices is made in the seventh step in 6 above, moreover, is that, when a structure is obtained in which these semiconductor devices are connected together, in the sixth step, it is necessary to separate off each semiconductor device. The situation is the same in step VI in 8 above.

DESCRIPTION OF THE PREFERRED EMBODIMENTS

Examples of embodiment aspects of the present invention are now described with reference to the drawings. The following descriptions relate merely to examples of the present invention and the present invention is not limited thereto or thereby.

Figure 1:
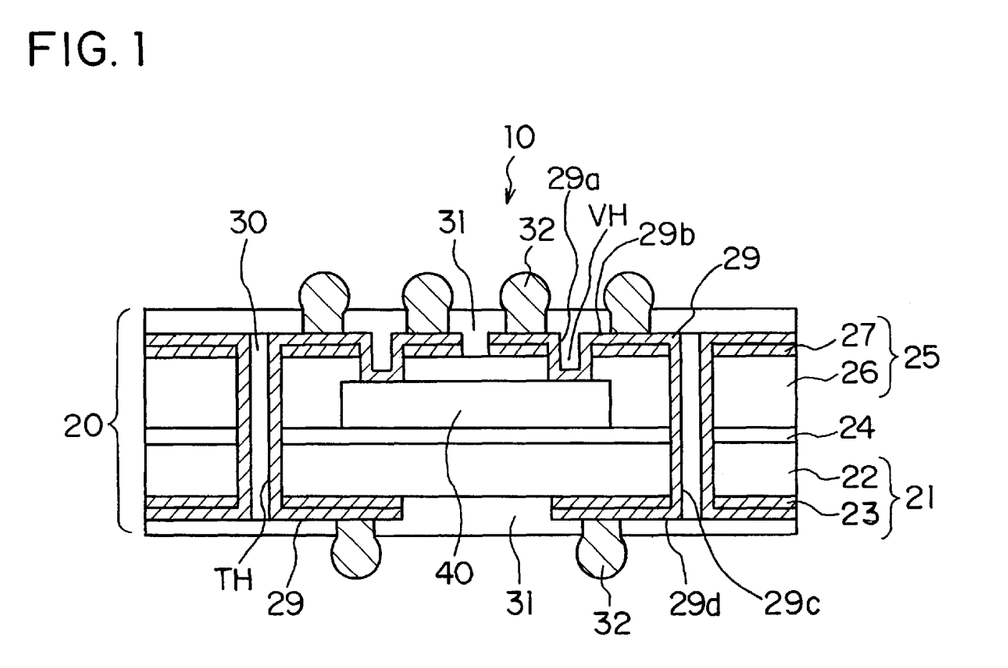
FIG. 1 is a cross-sectional view of the structure of a semiconductor device relating to a first embodiment aspect of the present invention.

FIG. 1 provides a model representation of the cross-sectional structure of a semiconductor device relating to a first embodiment aspect of the present invention.

The semiconductor device 10 relating to this embodiment aspect is configured by a wiring substrate 20 provided as a package and a semiconductor chip 40 imbedded/mounted inside that package (wiring substrate) 20.

In the package (wiring substrate) 20, the symbol 21 designates a base substrate constituting a base for the wiring substrate, having a structure wherein copper (Cu) foil 23 is formed as a conductor layer on one surface (the bottom surface in the case of the drawing) of a resin layer 22 acting as an insulating layer. The symbol 24 designates an adhesive layer formed on the other surface (on the side of the resin layer 22) of the base substrate 21, and the symbol 25 designates a copper-foiled resin film formed over the adhesive layer 24 in such a way that the semiconductor chip 40 is covered.

The copper-foiled resin film 25, like the base substrate 21, has a structure wherein copper foil 27 is formed as a conductor layer on one surface (on the upper side in the case of the drawing) of the resin film 26 acting as an insulating layer.

VH is a via hole formed at a certain position in the copper-foiled resin film 25 so as to extend to an electrode pad (terminal) on the semiconductor chip 40. TH is a through hole formed at a certain position in the copper-foiled resin film 25, where the semiconductor chip 40 is not imbedded/mounted, in such a way that it passes through the substrate in the up and down direction. Symbol 29 designates a wiring pattern (conductor layer) formed by patterning in a prescribed shape on the copper foils 23 and 27 inclusive of the inner walls of the via hole VH and the through hole TH. This wiring pattern 29 is formed in such a way that the electrode pad of the semiconductor chip 40 imbedded/mounted inside the package 20 is electrically connected to a conductor layer 29b on one surface side of the substrate via a conductor layer 29a on the inner wall surface of the via hole VH and also electrically connected to a conductor layer 29d on the other surface side of the substrate through a conductor layer 29c on the inner wall surface of the through hole TH.

Symbol 30 designates a resin (insulator) wherewith the inside of the through hole TH is filled, 31 a solder resist layer formed as a protective film covering the wiring pattern 29, resin layer 22, and resin film 26, and 32 a solder bump that functions as an external connection terminal for the device 10. The solder resist layer 31 is formed in such a way that it has an opening in the region corresponding to the terminal formation portion (pad part) of the wiring pattern 29, that is, in such a way that the terminal formation portion of the wiring pattern 29 is exposed. And to that terminal formation portion of the wiring pattern 29 so exposed are joined the solder bumps 32 acting as external connection terminals, as depicted in the diagram.

Meanwhile, the semiconductor chip 40 should be as thin as possible for mounting inside the package (wiring substrate) 20.

In the current technology, semiconductor chips are provided having thicknesses ranging from 50 µm to 100 µm or so. If the semiconductor chip is of such a thickness, it is sufficiently possible, technically, to imbed/mount the chip inside the substrate, but a thickness of 50 µm or less is preferable in order to achieve the object of the present invention.

In this embodiment aspect, a semiconductor chip 40 having a thickness of 50 µm or so is used.

The semiconductor device 10 relating to this embodiment aspect is characterized in that the thin semiconductor chip 40, having a thickness of 50 µm or so, is imbedded/mounted inside the package (wiring substrate) 20, and that the solder bumps 32 are formed as external connection terminals on both surfaces of the package (wiring substrate) 20, in such a way that the devices can be stacked in a multilayer, as required.

In the example depicted in FIG. 1, moreover, the solder bumps (external connection terminals) 32 are formed, but it is not always necessary to form them. It is sufficient that portions (terminal formation portions) of the wiring pattern 29 be exposed out of the solder resist layer 31 so that solder bumps or other external connection terminals can be connected.

A method for manufacturing the semiconductor device 10 of this embodiment aspect is now described while referring FIG. 2 and FIG. 3 which depict the manufacturing steps thereof in order.

To begin with, in a first process step (cf. FIG. 2A), the base substrate 21 is prepared in which is formed the copper foil 23 as a conductor layer on one surface of the resin layer 22 as the insulating layer, an adhesive is applied onto the other surface (resin layer 22 side) of this base substrate 21 (to form the adhesive layer 24), and a prescribed number of semiconductor chips 40 (thin chips having a thickness of 50 µm or so) are arranged suitably and mounted on that adhesive layer 24. The mounting of the semiconductor chips 40 is effected such that the surfaces of the chips which are on the opposite side to the surfaces on which the electrode pads (terminals) are formed, are bonded to the adhesive layer 24.

Figure 2A:
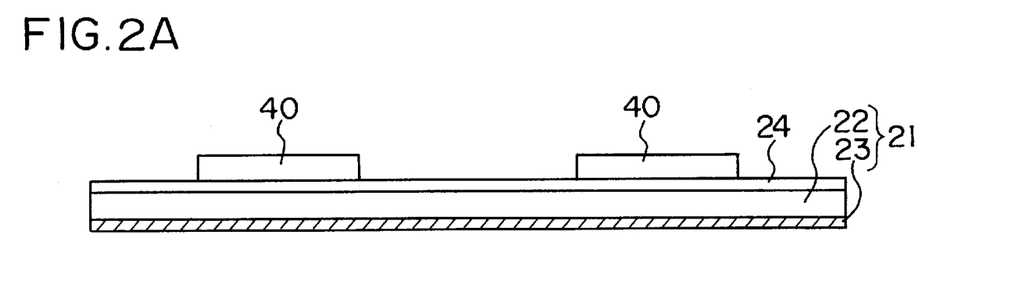
FIG. 2 provides cross-sectional views of manufacturing process steps for the semiconductor device diagrammed in FIG. 1.

For the material of the resin layer 22 constituting the base substrate 21, a thermosetting resin such as an epoxy resin, polyimide resin, or phenol resin, for example, is used.

In a specific form, for example, a base substrate 21 comprising a polyimide resin film whereto a polyimide type thermoplastic adhesive is applied, whereover copper foil is thermally press-bonded, can be used.

In the next process step (cf. FIG. 2B), the copper-foiled resin film 25, wherein the copper foil 27 is formed as a conductor layer on one surface of the resin film 26 acting as an insulating layer, is formed, with the side of the resin film 26 thereof facing down, over the adhesive layer 24, so as to cover the semiconductor chips 40.

Figures 2B, 2C:
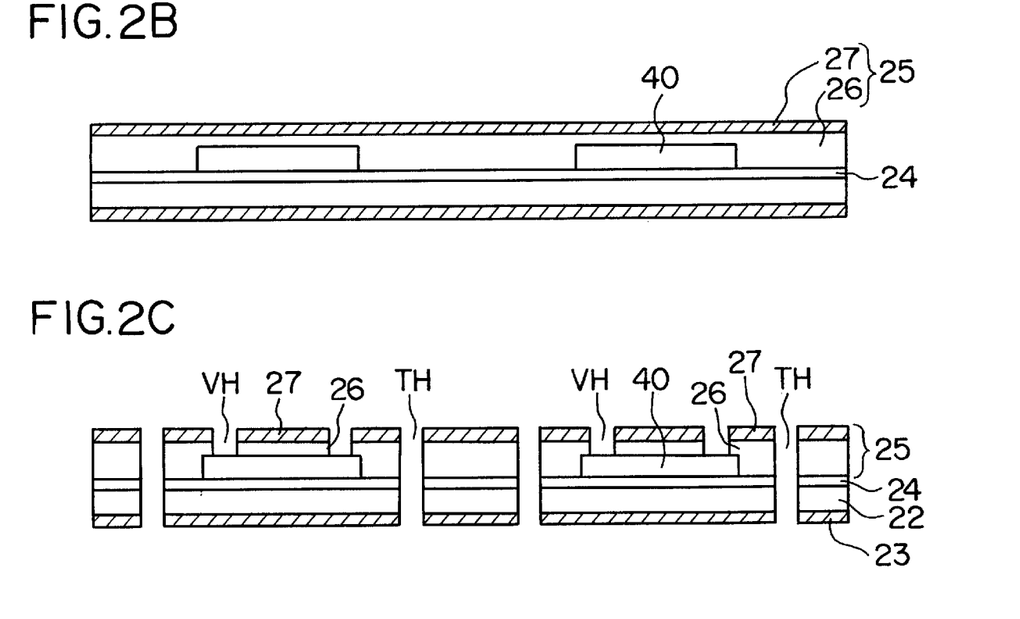
Figure 2D:
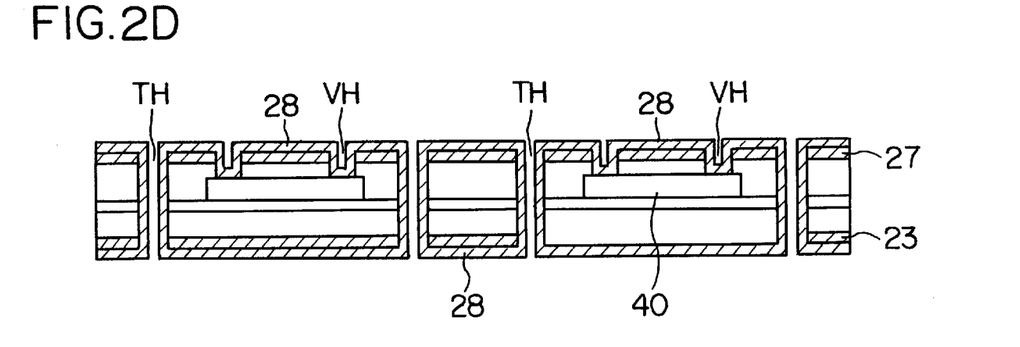

For the material of the resin film 26, as for the resin layer 22 described above, a thermosetting resin such as an epoxy resin or polyimide resin or the like is used. The form of the copper-foiled resin film 25 may be the same as the one for the base substrate 21 described earlier.

In the next process step (cf. FIG. 2C), at certain positions in the copper-foiled resin film 25, via holes VH are formed so as to reach to the electrode pads of the semiconductor chips 40.

At certain positions on the copper-foiled resin film 25 where the semiconductor chips 40 are not imbedded/mounted, through holes TH are formed so as to penetrate through the substrate in the up and down direction.

The process of opening the via holes VH is a two-step process comprising a process step for first removing portions of the copper foil 27 corresponding to the certain positions, by etching, and a process step for next removing the corresponding portions of the resin film 26, by, e.g., laser.

Similarly, the process of opening the through holes TH is also a two-step process comprising a process step for first removing portions of the copper foils 23 and 27 corresponding to the certain positions, by etching, and a process step for next removing the corresponding portions of the resin layer 22, resin film 26, and adhesive layer 24, by, e.g., laser. A $CO_2$ laser or excimer laser or the like can be used for the laser here.

Thereafter, as necessary, in the event that resin bits, contamination, or the like has been produced by the hole opening processes, a process (deburring, desmearing, etc.) may be performed to remove such.

In the next process (cf. FIG. 2D), on the copper foils 23 and 27, inclusive of the inner walls of the via holes VH and through holes TH, a conductor layer (copper layer) 28 is formed by copper electroplating using the copper foils as a power supply layer.

In the next process step (cf. FIG. 3A), the wiring pattern (copper layer) 29 is formed by subjecting the conductor layer 28 to patterning, and the interiors of the through holes TH are filled with a thermosetting resin (insulator 30) such as epoxy resin or the like.

Figure 3A:
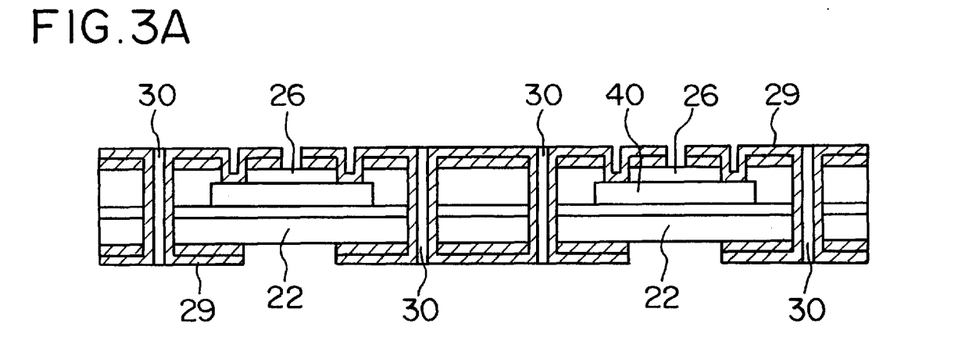
FIG. 3 provides cross-sectional views of manufacturing process steps that follow the manufacturing steps diagrammed in FIG. 2.

The patterning of the conductor layer 28 is performed, using a mask (not shown) that accords with the shape of the wiring pattern 29, in such a way that the electrode pads of the semiconductor chips 40 imbedded/mounted are electrically connected to the conductor layer on one surface side of the substrate via the conductor layers on the inner wall surfaces of the via holes VH, and in such a way that they are also electrically connected to the conductor layer on the other surface side of the substrate via the conductor layers on the inner wall surfaces of the through holes TH. At this stage, parts of the copper foils 23 and 27 exposed are also removed by etching, using the same mask.

In the next process step (cf. FIG. 3B), a photosensitive solder resist is applied onto the wiring pattern 29, resin layer 22, and resin film 26, whereupon exposure and developing (solder resist patterning) are performed so as to conform to the shapes of the terminal formation portions (pad portions) of the wiring pattern 29, and openings are formed in the solder resist layer at portions corresponding to the regions of those terminal formation portions.

Figure 3B:
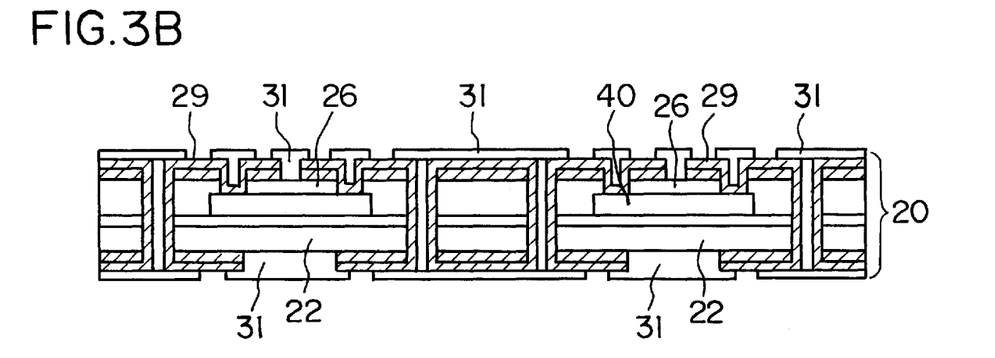

In this manner the terminal formation portions of the wiring pattern 29 are exposed, and the other portions of the wiring pattern 29 are covered by the solder resist layer 31. This solder resist layer 31 functions as a protective film for the package (wiring substrate) 20.

In the last process step (cf. FIG. 3C), the solder bumps 32 are formed as external connection terminals on both surfaces of the package (wiring substrate) 20, after which the semiconductor devices 10 are separated.

Figure 3C:
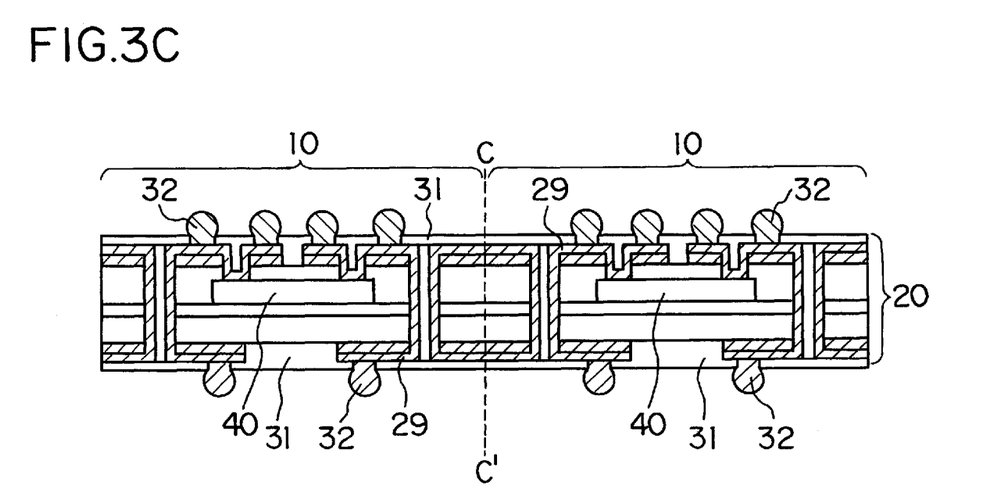

The solder bumps 32 are formed by bonding solder balls, by reflowing them, at the terminal formation portions of the wiring pattern 29 that are exposed at the openings in the solder resist layer 31. Furthermore, although not specifically diagrammed, before the solder balls are placed in the openings in the solder resist layer 31, it is preferable to form a conductor film, by copper-plating or the like, on the inner walls of the openings, in order to enhance solder wettability.

After that, a dicer or the like is used to divide each package, along the division line C–C', as indicated by the dashed line, in such a way that one semiconductor chip 40 is contained in each. Thereupon the semiconductor device 10 of this embodiment aspect diagrammed in FIG. 1 is fabricated.

Based on the semiconductor device 10 and manufacturing method therefor relating to this embodiment aspect, as described in the foregoing, thin semiconductor chips 40, having a thickness of 50 $\mu$m or so, are imbedded/mounted inside a package (wiring substrate) 20, as a result of which the semiconductor device 10 can be configured compactly.

Furthermore, solder bumps 32 are formed as external connection terminals on both surfaces of the package (wiring substrate) 20 (or, alternatively, terminal formation portions of the wiring pattern 29 are exposed in such a way that bumps or other external connection terminals (not diagrammed in FIG. 1) can be connected), and provision is made in such a way that multi-level stacking can be done, as necessary, as a result of which the semiconductor chips can be configured easily in a three-dimensional arrangement and interconnections can be effected easily through external connection terminals intervening therebetween. This contributes to realizing higher functionality in the semiconductor device.

Furthermore, a process step for mounting the semiconductor chips 40 is incorporated midway into the process for forming the wiring pattern on the insulating layer and fabricating the wiring substrate 20, as a result of which the manufacturing process can be made simpler than the conventional process of mounting the chips on the substrate after the wiring substrate has been fabricated.

Figure 4:
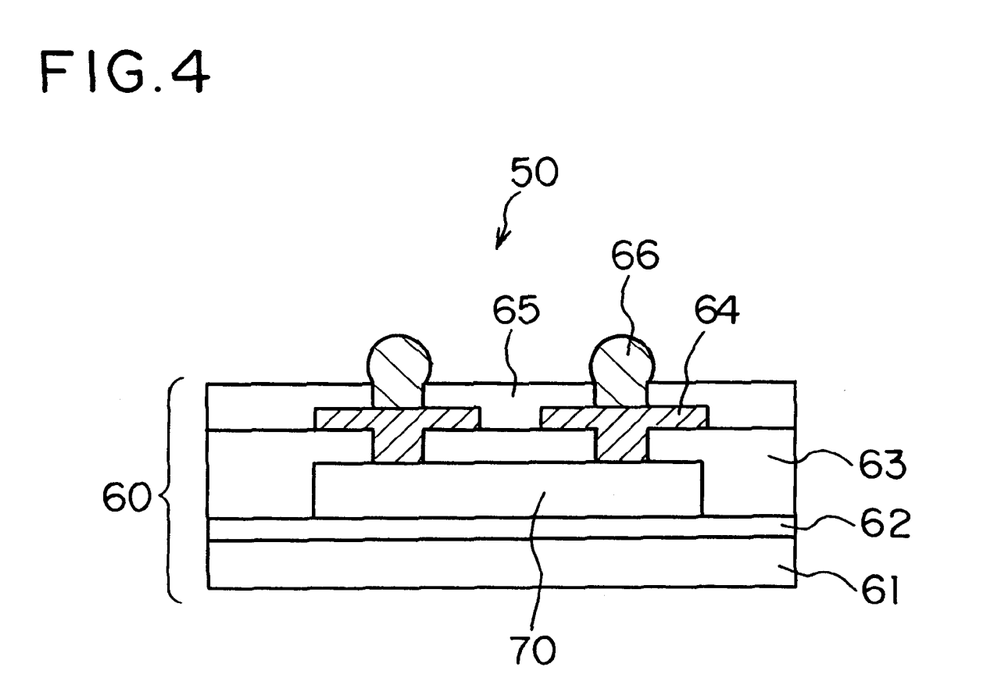
FIG. 4 is a cross-sectional view of the structure of a semiconductor device relating to a second embodiment aspect of the present invention.

FIG. 4 is a model representation of the cross-sectional structure of a semiconductor device relating to a second embodiment aspect of the present invention.

In this embodiment aspect, as in the first embodiment aspect described in the foregoing, a semiconductor device 50 is composed of a wiring substrate 60 provided as a package and a semiconductor chip 70 imbedded/mounted inside that package (wiring substrate) 60.

In the package (wiring substrate) 60, symbol 61 designates a base substrate acting as a base for the wiring substrate, 62 an adhesive layer formed on the base substrate 61, 63 a resin layer formed as an insulating layer over the adhesive layer 62 so as to cover the semiconductor chip 70, and 64 a wiring pattern (conductor layer) formed by patterning in a prescribed shape on the resin layer 63.

This wiring pattern 64 is formed in such a way that the interior of a via hole formed so as to extend to an electrode pad (terminal) of the semiconductor chip 70 at a certain position on the resin layer 63 is filled. The symbol 65 designates a solder resist layer formed as a protective film covering the wiring pattern 64 and the resin layer 63, and 66 designates solder bumps that function as external connection terminals for this device 50.

The solder resist layer 65 is formed in such a way that it has openings in regions corresponding to the terminal formation portions (pad portions) of the wiring pattern 64, that is, in such a way that the terminal formation portions of the wiring pattern 64 are exposed. To these exposed terminal formation portions of the wiring pattern 64 are connected the solder bumps 66 as external connection terminals, as diagrammed.

For the semiconductor chips 70 that are imbedded/ mounted inside the package (wiring substrate) 60, a thin chip is used having a thickness of 50 $\mu$m or so, as in the first embodiment aspect. The semiconductor device 50 relating to this embodiment aspect is one in which the thin semiconductor chips 70, having a thickness of 50 $\mu$m or so, are imbedded/mounted inside the package (wiring substrate) 60, and in which the solder bumps 66 are formed as external connection terminals on one surface of the package (wiring substrate) 60.

In this embodiment aspect also, as in the first embodiment aspect, it is not always necessary that the solder bumps (external connection terminals) 66 be formed. That is, it is sufficient that portions (terminal formation portions) of the wiring pattern 64 be exposed out of the solder resist layer 65 in such a way that it is possible for the solder bumps or other external connection terminals to be connected.

A method for manufacturing the semiconductor device 50 of this embodiment aspect is now described while referring FIG. 5 which diagrams the manufacturing process steps therein.

To begin with, in a first process step (cf. FIG. 5A), an adhesive is applied onto the base substrate 61 (adhesive layer 62), and, further, a prescribed number of semiconductor chips 70 (thin chips having a thickness of 50 $\mu$m or so) are suitably allocated and mounted on the adhesive layer 62. The mounting of the semiconductor chips 70 is effected such that the surface which is on the opposite side of the chip to the surface on which the electrode pads (terminals) are formed, is bonded to the adhesive layers 62.

Figure 5A:
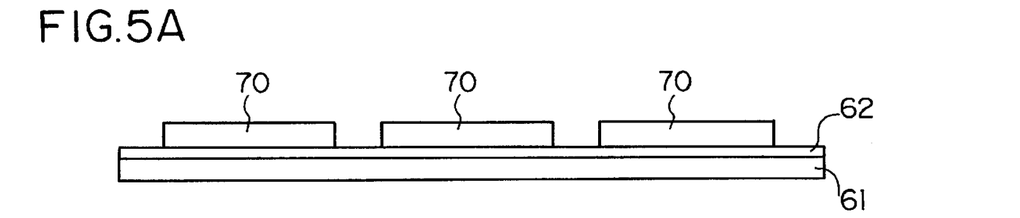
FIG. 5 provides cross-sectional views of manufacturing process steps for the semiconductor device diagrammed in FIG. 4.
Figure 5B:
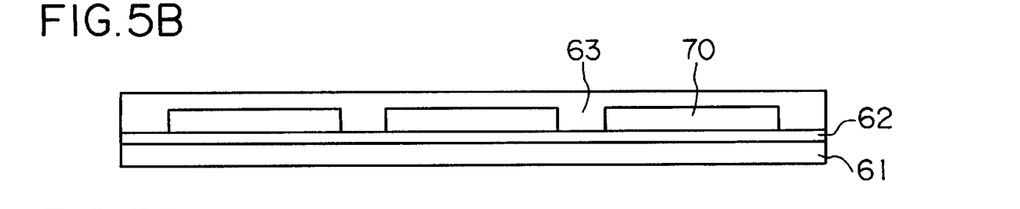

For the material of the base substrate 61, either an insulative material or an electrically conductive material may be used. For an insulative material, a glass epoxy resin or glass BT resin or the like may be used, for example, whereas for an electrically conductive material, copper (Cu) is typically used, although aluminum (Al) or some other metal may also be used.

In the next process step (FIG. 5B), a resin layer 63 is formed as an insulating layer over the adhesive layer 62 so as to cover the semiconductor chips 70. For the material of this resin layer 63, a thermosetting resin such as an epoxy resin or polyimide resin or the like is used, for example. Alternatively, a photosensitive resin, such as a photosensitive epoxy resin or photosensitive polyimide resin, may be used.

In the next process step (FIG. 5C), via holes VH are formed in a hole opening process using a $CO_2$ laser, excimer laser, or the like in such a way that they extend to the electrode pads of the semiconductor chips 70, at certain positions in the resin layer 63 (laser via process).

Figure 5C:
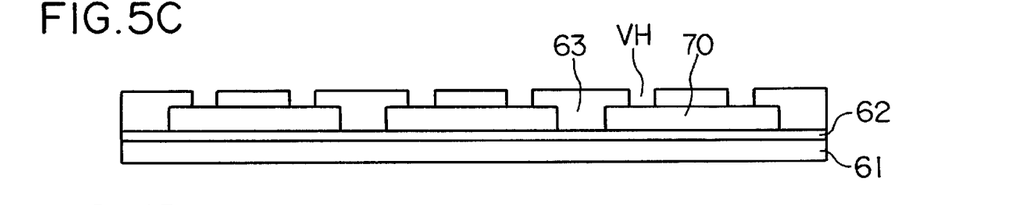

When a photosensitive resin such as a photosensitive epoxy resin or the like is used for the material of the resin layer 63, the via holes VH can be formed using ordinary photolithographic technology (photo via process). In that case, the via holes VH can of course be formed using a laser or the like.

After that, as in the case of the first embodiment aspect, deburring, desmearing, or the like is performed as necessary.

In the next process step (cf. FIG. 5D), the wiring pattern (conductor layer) 64 is formed, by patterning, on the resin layer 63, filling the interiors of the via holes VH.

Figure 5D:
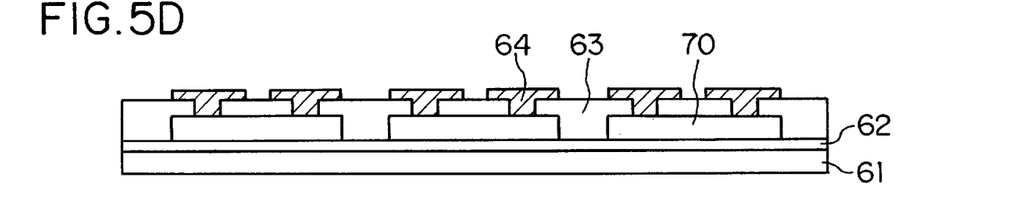

This wiring pattern (conductor layer) 64 is formed as described below, for example. First, a thin-film form copper layer is formed by non-electrolytic copper-plating on the resin layer 63, inclusive of the interiors of the via holes VH. Then a photosensitive resist (not shown) is applied onto that thin-film form copper layer, and exposure and developing (resist patterning) are performed to conform to the shape of the wiring pattern.

Next, copper electroplating is performed using this resist pattern as a mask for plating and using the thin-film form copper layer as a power supply layer, to form a somewhat thick conductor layer. After that, the resist pattern is removed, the exposed portions of the thin-film form copper layer are removed by etching, and the wiring pattern (conductor layer) 64, patterned as is illustrated, is formed.

In the next process step (cf. FIG. 5E), a photosensitive solder resist is applied onto the wiring pattern 64 and resin layer 63, exposure and developing (solder resist patterning) are performed so as to conform to the shape of the terminal formation portions of the wiring pattern 64, and openings are formed in the solder resist layer at portions corresponding to the regions of those terminal formation portions.

Figure 5E:
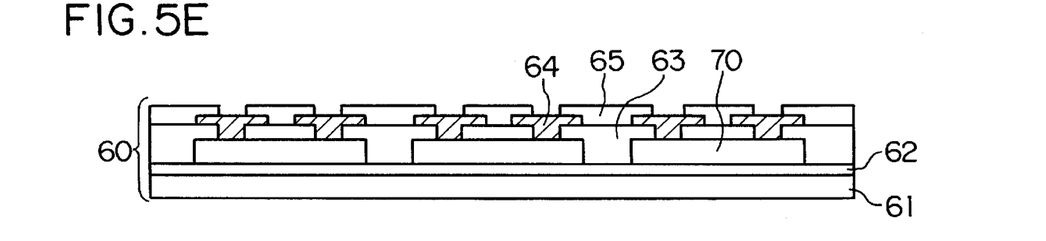

Thus the terminal formation portions of the wiring pattern 64 will be exposed, while the other portions of the wiring pattern 64 will be covered by the solder resist layer 65. This solder resist layer 65 functions as a protective film for the package (wiring substrate) 60.

In the final process step (cf. FIG. 5F), solder bumps 66 are formed as external connection terminals on the surface which is on the opposite side to the base substrate 61, after which division is made into the semiconductor devices 50. The solder bumps 66 are formed by bonding solder balls, by reflowing them, at the terminal formation portions of the wiring pattern 64 that are exposed at the openings in the solder resist layer 65.

Figure 5F:
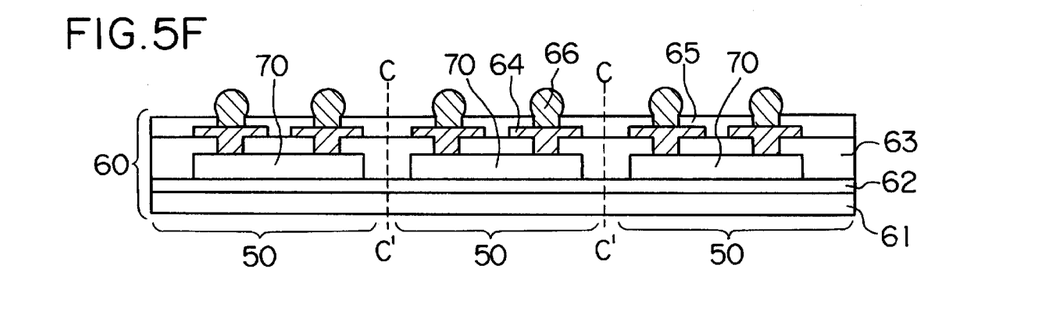

At such time, as in the first embodiment aspect, before the solder balls are placed in the openings in the solder resist layer 65, it is advisable to form a conductor film, by copper-plating or the like, on the inner walls of the openings, in order to enhance solder wettability.

After that, a dicer or the like is used to effect division into the packages, along the division lines C–C', as indicated by the dashed lines, in such a way that one semiconductor chip 70 is contained in each. Thereupon the semiconductor device 50 of this embodiment aspect diagrammed in FIG. 4 is fabricated.

With this embodiment aspect also, as with the first embodiment aspect, thin semiconductor chips 70, having a thickness of 50 $\mu$m or so, are imbedded/mounted inside a package (wiring substrate) 60, as a result of which the semiconductor device 50 can be configured compactly.

Also, because a process step for mounting the semiconductor chips 70 is incorporated midway into the process for manufacturing the wiring substrate 60, the manufacturing process can be made simpler compared to the conventional process.

This semiconductor device can also be used in a form wherein it is stacked so as to be electrically connected at the top of the semiconductor device of the first embodiment aspect, making it possible to effect higher functionality in the semiconductor device.

In the embodiment aspects described in the foregoing, external connection terminals (solder bumps 32 and 66) are formed prior to division into the individual semiconductor devices 10 and 50 in the process steps diagrammed in FIG. 3C and FIG. 5F, but, as noted earlier, it is not always necessary to form these external connection terminals.

That is, it is sufficient that the terminal formation portions of the wiring patterns 29 and 64 be exposed to make it possible for the external connection terminals to be connected. Accordingly, in the process steps illustrated in FIG. 3C and FIG. 5F, it is permissible to perform only the process of simply dividing the structure into the semiconductor devices 10 and 50.

In the embodiment aspects described in the foregoing, moreover, the description assumes the case where the semiconductor device is in a form analogous to the so-called chip size package (CSP), but the form of the semiconductor device is of course not limited thereto or thereby.

In the process diagrammed in FIG. 3C or FIG. 5F, for example, in the embodiment aspects described in the foregoing, the structure is divided into individual packages in such a way that each contains one semiconductor chip 40 or 70 (that is, in the CSP form). However, instead of such a divided form, division may be made in such a way that each package contains two or more semiconductor chips 40 or 70. By effecting such a divided form as that, the semiconductor devices can be given a multi-chip module (MCM) form, making it possible to realize even higher functionality in the semiconductor devices.

Furthermore, in the first embodiment aspect described earlier, a copper-foiled resin film 25 is used in the process step diagrammed in FIG. 2B, but, instead of using such a copper-foiled resin film 25, a process step may be adopted for forming a thin-film form copper layer (corresponding to the copper foil 27) after forming the insulating layer (corresponding to the resin film 26).

In that case, non-electrolytic plating, sputtering, vapor deposition, etc., can be used as the film-forming method for forming the thin-film form copper layer.

This is the same in the case of the second embodiment aspect. When the wiring pattern 64 in the second embodiment aspect is formed (cf. FIG. 5D), non-electrolytic plating is used as the film-forming method for forming the thin-film form copper layer (power supply layer for plating), but, instead of this, sputtering, vapor deposition or the like may be used.

According to the present invention, as described in the foregoing, a compact configuration can be effected when mounting semiconductor elements in a package, and, as necessary, a configuration wherein the semiconductor elements are arranged three-dimensionally and interconnected can be easily effected, so that higher functionality can thus be achieved.

What is claimed is:

1. A semiconductor device, comprising:

a wiring substrate, having wiring patterns formed on first and second opposing surfaces thereof, with an insulating layer therebetween, and a solder resist layer formed on each of the first and second surfaces to cover said wiring patterns and said insulating layer, except for terminal formation portions of said wiring patterns, to which external connection terminals of a semiconductor element are connected, which terminal formation portions are exposed through the solder resist layers;

at least one semiconductor element imbedded in the wiring substrate;

via holes formed in the first surface of the wiring substrate to reach electrode terminals of the semiconductor element; and through holes extending between the first and second surfaces;

wherein said wiring patterns on said first and second surfaces include a first conductor layer in the via hole, which first layer connects to a second conductor layer on the first surface of the substrate outside of the via hole, which second conductor layer includes at least one of the terminal formation portions, and to a third conductor layer formed in the through holes, which third conductor layer connects to a fourth conductor layer on the second surface which includes at least one of the terminal formation portions, wherein the semiconductor element and the terminal formation portions on the first and second surfaces are connected by the first through fourth conductor layers, the via holes are directly connected to the semiconductor element via the first conductor layer, and only the terminal formation portions are exposed through the solder resist layers, and wherein the terminal formation portions on a first surface of one of the semiconductor devices contacts and is directly connected to the terminal formation portions on a second surface of another of the semiconductor devices to form a stack of semiconductor devices.

2. The semiconductor device according to claim 1, wherein thickness of said semiconductor element is 100 $\mu$m or less.

3. The semiconductor device as recited in claim 1, wherein a thickness of said semiconductor element is 50 $\mu$m or less.

4. The semiconductor device as recited in claim 1, wherein the terminal formation portions are solder balls.

5. The semiconductor device as recited in claim 1, wherein the terminal formation portions are portions of said wiring patterns exposed through the solder resist layers.

* * * * *